(12) United States Patent
Choi et al.

(10) Patent No.: US 10,809,596 B2
(45) Date of Patent: Oct. 20, 2020

(54) FLASH MODULE AND TERMINAL COMPRISING SAME

(71) Applicant: LG INNOTEK CO., LTD., Seoul (KR)

(72) Inventors: Jong Beom Choi, Seoul (KR); Tae Sung Lee, Seoul (KR); Min Ji Jin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/302,308

(22) PCT Filed: May 19, 2017

(86) PCT No.: PCT/KR2017/005234
§ 371 (c)(1),
(2) Date: Nov. 16, 2018

(87) PCT Pub. No.: WO2017/200341
PCT Pub. Date: Nov. 23, 2017

(65) Prior Publication Data
US 2019/0302573 A1    Oct. 3, 2019

(30) Foreign Application Priority Data

May 19, 2016  (KR) .................. 10-2016-0061544
Jul. 5, 2016   (KR) .................. 10-2016-0084778

(51) Int. Cl.
*G03B 15/05*    (2006.01)
*H01L 33/50*    (2010.01)
(Continued)

(52) U.S. Cl.
CPC ............. *G03B 15/05* (2013.01); *G03B 15/02* (2013.01); *G03B 15/03* (2013.01); *H01L 33/505* (2013.01);
(Continued)

(58) Field of Classification Search
CPC ... F21V 5/04; G02B 19/0066; G02B 27/0955; G02B 3/08; G02B 7/022; H04N 5/2256;
(Continued)

(56) References Cited

U.S. PATENT DOCUMENTS

2004/0201987 A1  10/2004 Omata
2008/0142822 A1   6/2008 Kim et al.
(Continued)

FOREIGN PATENT DOCUMENTS

CN    104614918 A    5/2015
CN    105221938 A    1/2016
(Continued)

OTHER PUBLICATIONS

International Search Report (with English Translation) and Written Opinion dated Nov. 8, 2017 issued in Application No. PCT/KR2017/005234.
(Continued)

*Primary Examiner* — Ahmed N Sefer
(74) *Attorney, Agent, or Firm* — Ked & Associates, LLP

(57) ABSTRACT

An embodiment may have a substrate (110) including a predetermined cavity (C); a plurality of light emitting chips (120) spaced apart from the cavity (C) of the substrate (110); a frame (130), disposed on the substrate (110) including a support portion (132) and a guide portion (134) including a predetermined through hole (H1); and a lens unit (140) disposed in the through hole (H1) of the guide portion (134).

17 Claims, 6 Drawing Sheets

(51) Int. Cl.
   *H01L 33/58* (2010.01)
   *G03B 15/03* (2006.01)
   *G03B 15/02* (2006.01)

(52) U.S. Cl.
   CPC ...... *H01L 33/58* (2013.01); *G03B 2215/0567* (2013.01)

(58) Field of Classification Search
   CPC . H04N 5/2354; H04N 5/2254; H05B 33/0857
   See application file for complete search history.

(56) References Cited

U.S. PATENT DOCUMENTS

| 2010/0044726 | A1* | 2/2010 | Li | B29C 45/14655 |
| | | | | 257/88 |
| 2010/0178046 | A1* | 7/2010 | Moon | F21L 4/02 |
| | | | | 396/155 |
| 2010/0277054 | A1 | 11/2010 | Takashima et al. | |
| 2013/0003342 | A1 | 1/2013 | You | |
| 2014/0022762 | A1 | 1/2014 | Zheng et al. | |
| 2014/0240975 | A1 | 8/2014 | Lee et al. | |
| 2015/0345748 | A1 | 12/2015 | Saito | |

FOREIGN PATENT DOCUMENTS

| JP | S63-38272 | 2/1988 |
| JP | 2006-221098 | 8/2006 |
| KR | 10-1194129 | 10/2012 |
| KR | 10-2013-0003835 | 1/2013 |
| KR | 10-2014-0108756 | 9/2014 |
| KR | 10-2015-0090681 | 8/2015 |

OTHER PUBLICATIONS

European Search Report dated Dec. 5, 2019 issued in EP Application No. 17799698.0.
Chinese Office Action dated Aug. 17, 2020 issued in Application 201780030947.9.

* cited by examiner

FLASH MODULE AND TERMINAL COMPRISING SAME

CROSS-REFERENCE TO RELATED PATENT APPLICATIONS

This application is a U.S. National Stage Application under 35 U.S.C. § 371 of PCT Application No. PCT/KR2017/005234, filed May 19, 2017, which claims priority to Korean Patent Application No. 10-2016-0061544, filed May 19, 2016, and Korean Patent Application No. 10-2016-0084778, filed Jul. 5, 2016, whose entire disclosures are hereby incorporated by reference.

TECHNICAL FIELD

Embodiments relate to a camera flash and a terminal including the same.

BACKGROUND ART

Semiconductor devices including compounds such as GaN and AlGaN have many merits such as wide and easy bandgap energy, and can be used variously as light emitting devices, light receiving devices, and various diodes.

Particularly, a light emitting device such as a light emitting diode or a laser diode using a semiconductor material of a III-V group or a II-VI group compound semiconductor has been widely used in various fields such as red, blue, and ultraviolet rays. By using fluorescent materials or combining colors, it is possible to implement white light with high efficiency. Also, compared to conventional light sources such as fluorescent lamps and incandescent lamps, the light emitting device has many merits such as low power consumption, speed, safety, and environmental friendliness.

In addition, when a light-receiving element such as a photodetector or a solar cell is manufactured using a semiconductor material of Group III-V or Group II-VI compound semiconductor, development of an element material absorbs light of various wavelength regions to generate a photocurrent light of various wavelength ranges from gamma rays to radio wavelength regions can be used. It also has advantages of fast response speed, safety, environmental friendliness and easy control of device materials, so that it can be easily used for power control or microwave circuit or communication module.

Therefore, applications of light-emitting diode are extended to a transmission module of the optical communication means, a light-emitting diode backlight replacing a cold cathode fluorescent lamp (CCFL) constituting a backlight of an LCD (Liquid Crystal Display) display device, a white light emitting diode lighting devices, automotive headlights, traffic lights and sensors for gas and fire detection. Applications can also be extended to high frequency application circuits, other power control devices, and communication modules.

In recent years, the number of portable terminals with camera functions is increasing. In such a portable terminal, a flash is built in to provide the amount of light necessary for photographing a camera. In this connection, the use of semiconductor devices such as a white LED (Light Emitting Diode) as a light source of a camera flash is increasing.

On the other hand, as a method of implementing white light using a light emitting device, there are a method using a single chip and a method utilizing a multi-chip.

For example, in the case of implementing white light by a single chip, a method of using light emitted from a blue LED and exciting at least one of the phosphors using the light to obtain white light is used.

In addition, a method of implementing white light in the form of a single chip is divided into a method of combining a fluorescent substance on a blue or ultraviolet (UV) light emitting diode chip and a method of producing a multi-chip type and combining them to obtain white light. In the case of a multi-chip type, there is a typical method of manufacturing three kinds of chips of RGB (Red, Green, and Blue).

Meanwhile, in order to implement a vivid color in a camera, the role of a camera flash is important. A vivid color can be expressed by a color quality scale (CQS) index. In the related art, CQS (Color Quality Scale) The index is about 70~80, so there is a limit to achieve a clear color.

For example, since the flash used in a mobile phone of the related art is different from the wavelength distribution of the wavelength spectrum of sunlight, which is a reference of bright color, it is difficult to implement a clear color.

In order to implement such a vivid color, a high color reproduction ratio must be supported. However, the related art has a low color reproduction rate and thus has a limitation in the implementation of a vivid color.

Meanwhile, in recent years, there has been a technological development in which a portable terminal, for example, a camera of a mobile phone is switched to a dual camera which is a camera of a wide angle and a general angle. In order to cope with the trend of technological development of such a mobile phone camera, it is also required to implement a wide angle to correspond to the camera field of view (FOV). On the other hand, according to the related art, it has been difficult to implement the angle of view (FOV) of the camera flash at 90 degrees or more.

However, the slimness and trend of the portable terminal continue with the demand of the industry requiring such a wide-angle view angle, and in the conventional camera flash module, since the flash lens can be mounted and combined only if the flash lens is maintained at a certain thickness There is a problem in that it cannot satisfy the trend demand for slimness while maintaining the wide angle. In addition, according to the related art, it is important that a uniform light distribution should be implemented in a camera image pickup area even if a wide angle is implemented. In addition, it is difficult to implement a wide angle, because there is a technical contradiction that a uniform light distribution cannot be implemented at a wide angle. Further, according to the related art, as the process of attaching the flash lens to a separate terminal cover proceeds with the SMT (Surface Mounting Technology) process of the light emitting module package, the SMT tolerance and the tolerance when attaching the lens are increased, The alignment accuracy of the chip and the flash lens is lowered so that a uniform light distribution cannot be implemented. In addition, such uneven light distribution is obstructing the implementation of a clear color.

DISCLOSURE

Technical Problem

One of the technical problems to be solved of the embodiments is to provide a flash module and a terminal capable of implementing a clear color.

One of the technical problems to be solved of the embodiments is to provide a flash module capable of implementing a wide angle of view (FOV) of a camera flash and a terminal including the camera so that the camera can cope with the technical development of the terminal.

In addition, one of the technical problems to be solved of the embodiments is to provide a flash module and a terminal including the flash module that can simultaneously satisfy a slim trend of a terminal and a wide angle of view (FOV) technical characteristics.

It is another one of the technical problems to be solved of the embodiments to provide a flash module and a terminal including the same, which can implement a wide angle of view (FOV) while implementing a uniform light distribution in a camera image sensing area.

It is another one of the technical problems to be solved of the embodiments to provide a flash module and a terminal including the same, which can implement uniform light distribution by significantly improving the alignment accuracy of the light emitting chip and the flash lens of the light emitting module.

The technical problems of the embodiments are not limited to those described in this item, but also include technical problems that are comprehended through the entire specification.

Technical Solution

A flash module according to an embodiment of the embodiments includes a substrate including a predetermined cavity, a plurality of light emitting chips spaced apart from a cavity of the substrate, a guide portion including a predetermined through hole, and a support portion and a lens unit disposed in the through hole of the guide portion.

And a plurality of light diffusion patterns may be formed on a bottom surface of the lens unit. The upper surface of the lens unit may be disposed at a position lower than or equal to the guide portion of the frame. The lens unit may be injection molded in the guide portion. The height of the lens part may be smaller than the guide part of the frame. The center of each of the plurality of light diffusion patterns may be overlapped with the center of each of the plurality of light emitting chips.

The flash module of the embodiment may include a frame, a light emitting chip disposed in the frame including the phosphor composition, and a lens unit disposed on the frame.

The wavelength intensity of the wavelength spectrum of the flash module at 400 nm to 420 nm may be larger than the wavelength intensity of the solar light source at 400 to 420 nm.

The wavelength intensity of the wavelength spectrum of the flash module at 650 nm to 670 nm may be greater than the wavelength intensity of the solar light source at 650 nm to 670 nm.

In the phosphor composition of the embodiment, the light emission center wavelength of the light emitting chip is 400 nm to 420 nm, and the wavelength intensity of the light emission center wavelength of 400 nm to 420 nm of the light emitting chip, may be greater than the wavelength intensity of 400 nm to 420 nm of the solar light source.

The red phosphor may have a luminescent center wavelength of 650 nm to 670 nm with an excitation wavelength of 400 nm to 420 nm of the light emitting chip and the wavelength intensity of the excitation center wavelength of 650 nm to 670 nm of the red phosphor may be greater than the wavelength intensity of 650 nm to 670 nm of the solar light source.

The terminal according to the embodiment may include the flash module.

Advantageous Effects

One of the technical effects of the embodiment is to provide a flash module capable of implementing a clear color and a terminal including the flash module.

Embodiments provide a flash module capable of implementing a wide angle of view (FOV) of a camera flash (Flash) and a terminal including the flash module so as to effectively cope with camera technical development of a terminal.

Also, the embodiment has a technical effect that can provide a flash module and a terminal including the flash module that can simultaneously satisfy a slim trend of a terminal and a wide angle of view (FOV) technical characteristics.

Further, the embodiment has a technical effect to provide a flash module and a terminal including the same, which can implement a uniform light distribution in a camera image sensing area while implementing a wide angle of view (FOV).

In addition, the embodiment has a technical effect that it is possible to provide a flash module and a terminal including the flash module which can implement a uniform light distribution by significantly improving the alignment accuracy of the light emitting chip and the flash lens of the light emitting module.

The technical effects of the embodiments are not limited to those described in this item, but also include technical effects that are comprehended through the entire specification.

MODE FOR INVENTION

Reference will now be made in detail to the preferred embodiments of the embodiments, examples of which are illustrated in the accompanying drawings.

In the description of the embodiments, when it is described as being formed "on or under" of each element, wherein both elements are in direct contact with each other or one or more other elements are indirectly formed between the two elements. Also, when expressed as "on or under", it may include not only an upward direction but also a downward direction with respect to one element.

The semiconductor device may include various electronic devices such as a light emitting device and a light receiving device. The light emitting device and the light receiving device may include a first conductivity type semiconductor layer, an active layer, and a second conductivity type semiconductor layer. The semiconductor device according to the embodiment may be a light emitting device. The light emitting device emits light by recombination of electrons and holes, and the wavelength of the light is determined by the energy band gap inherent to the material. Thus, the light emitted may vary depending on the composition of the material.

Example

Figure 1:
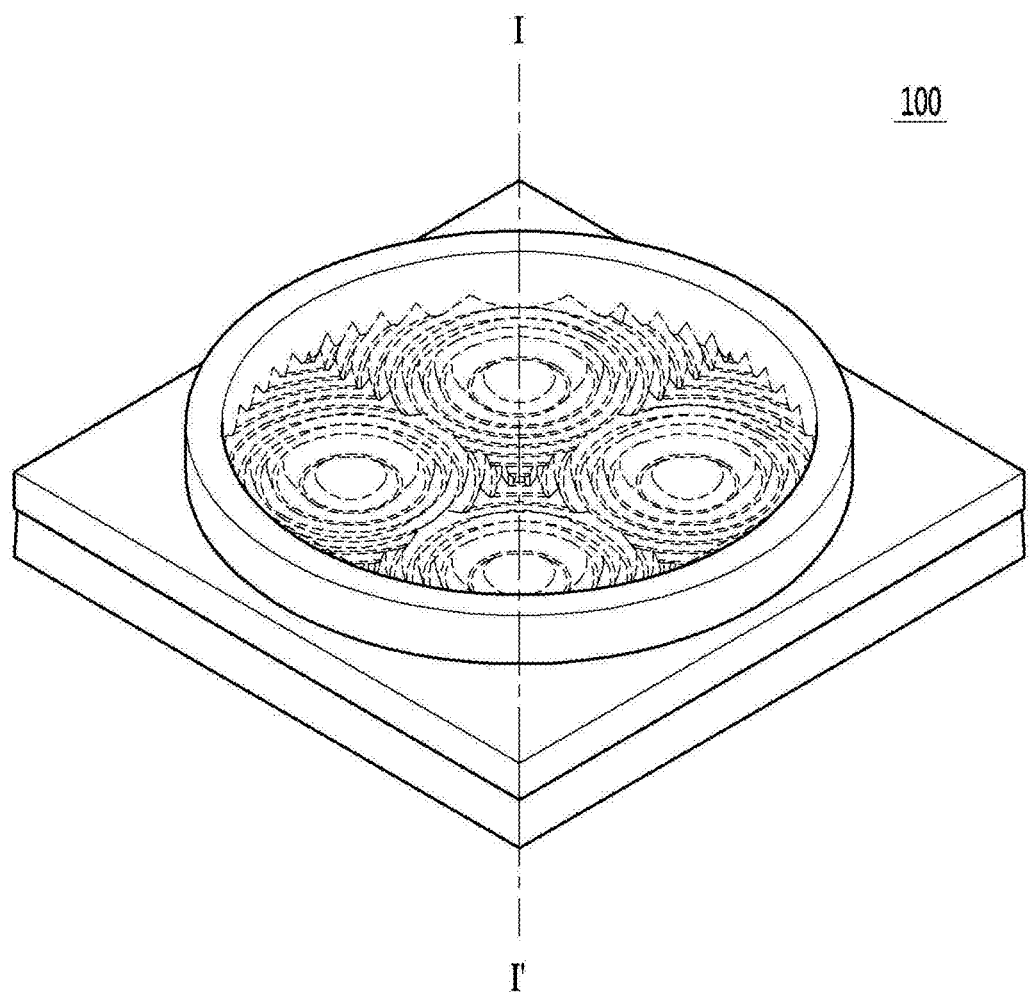
FIG. 1 is a perspective view of a flash module according to an embodiment.
Figure 2:
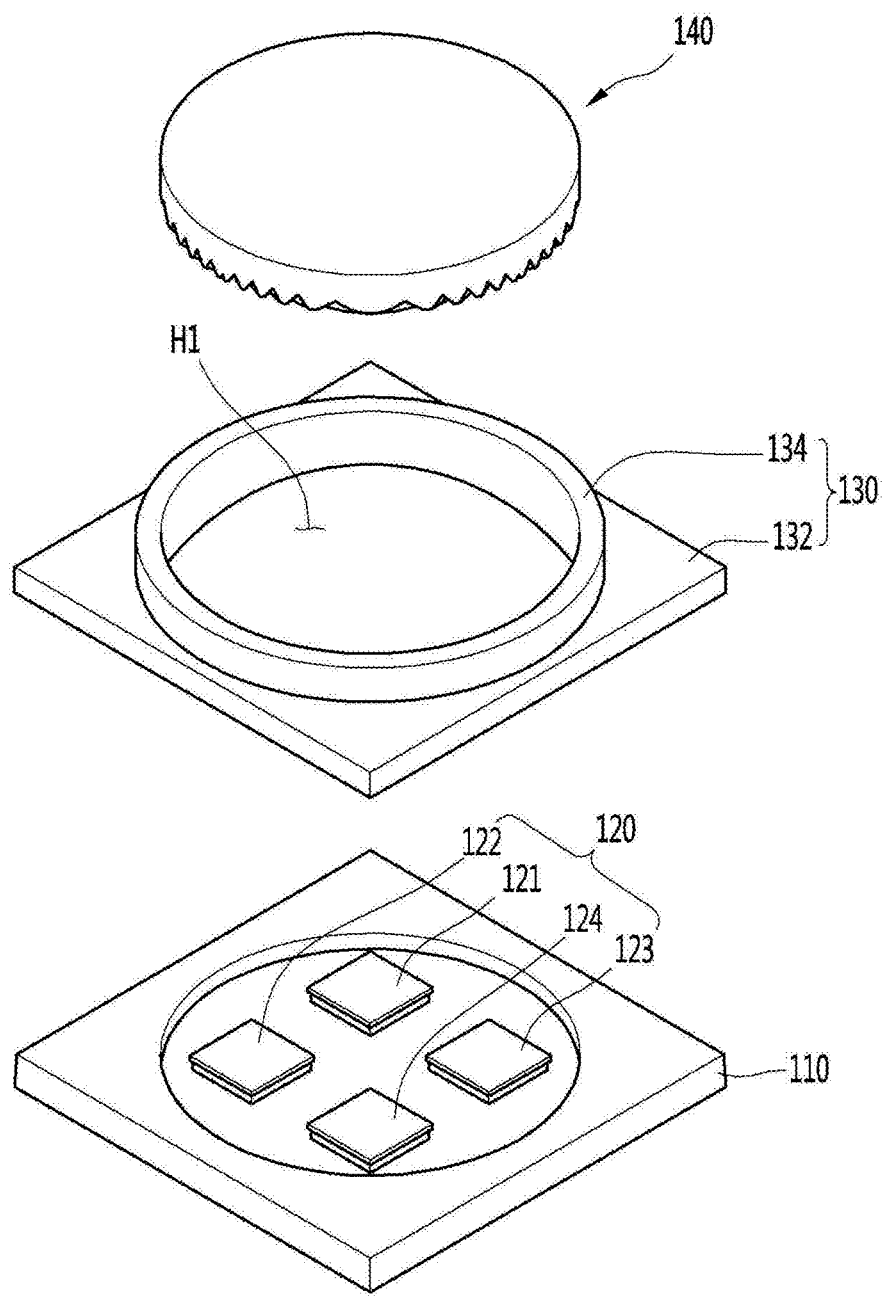
FIG. 2 is an exploded perspective view of a flash module according to an embodiment.

FIG. 1 is a perspective projection view of a flash module 100 according to an embodiment, and FIG. 2 is an exploded perspective view of a flash module 100 according to an embodiment.

Figure 3:
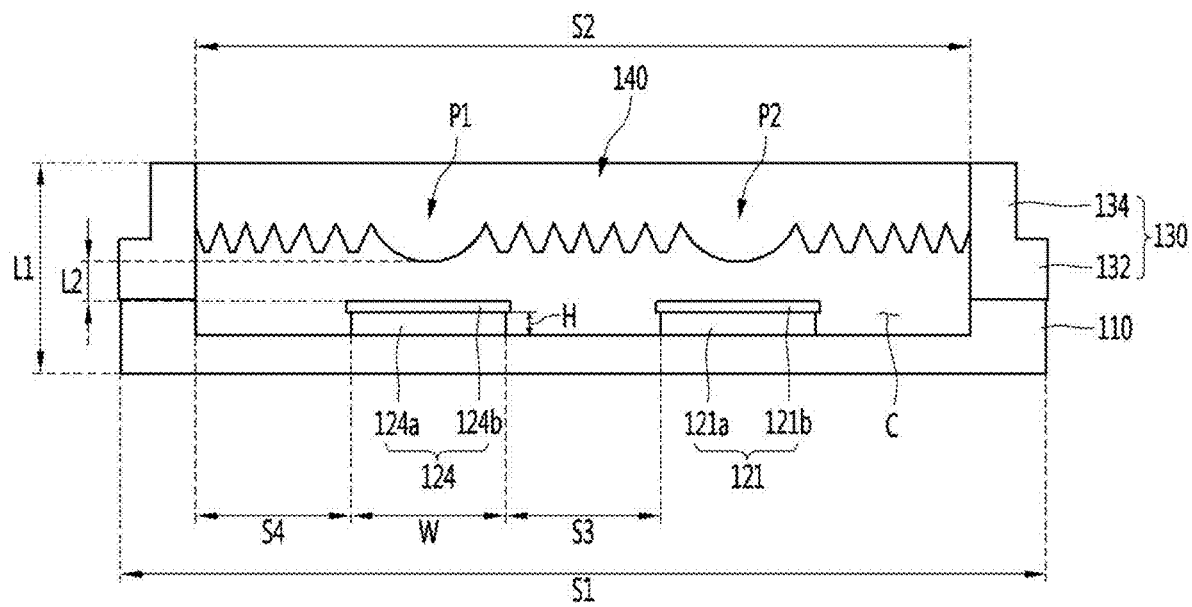
FIG. 3 is a cross-sectional view of a flash module according to an embodiment.
Figure 4:
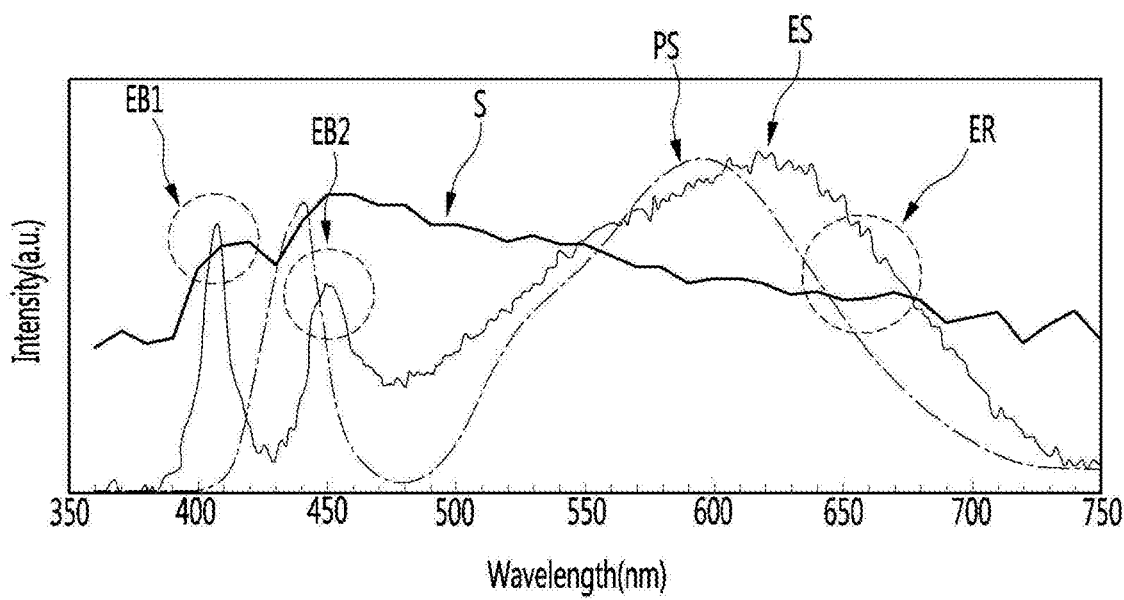
FIG. 4 is a comparative example of the wavelength spectrum of sunlight, the light emission wavelength spectrum of the comparative example, and the luminescence spectrum in the light emitting chip of the flash module according to the embodiment. FIG.

FIG. 3 is a cross-sectional view taken along the line I-I' of the flash module 100 according to the embodiment shown in FIG. 1, and FIG. 4 is a perspective view of the lens unit 140 in the flash module according to the embodiment. In FIG. 4, the lens unit 140 is a perspective view of the lens unit 140 shown in FIGS. 2, 3.

FIG. 2, the flash module 100 according to the embodiment may include at least one of a substrate 110, a plurality of light emitting chips 120, a frame 130, and a lens unit 140.

The plurality of light emitting chips 120 may include a plurality of light emitting chips, for example, two or more light emitting chips spaced apart from each other. For example, in the embodiment, the plurality of light emitting chips 120 may include a first light emitting chip 121, a second light emitting chip 122, a third light emitting chip 123 and a fourth light emitting chip 124 spaced apart from each other, but the embodiment is not limited thereto.

In an embodiment, the plurality of light emitting chips 120 may be formed of a compound semiconductor such as a semiconductor compound, for example, a group III-V, a group II-VI, but it is not limited thereto. For example, the first and second conductivity type semiconductor layers may include a semiconductor material having a composition formula of $In_xAl_yGa_{1-x-y}N$ ($0 \leq x \leq 1$, $0 \leq y \leq 1$, $0 \leq x+y \leq 1$). The first and second conductivity type semiconductor layers may be formed of one or more of GaN, InN, AlN, InGaN, AlGaN, InAlGaN, AlInN, AlGaAs, InGaAs, AlInGaAs, GaP, AlGaP, InGaP, AlInGaP, InP. The first conductive semiconductor layer may be an n-type semiconductor layer, and the second conductive semiconductor layer may be a p-type semiconductor layer, but the embodiment is not limited thereto.

The active layer may be formed of at least one of a single quantum well structure, a multi quantum well (MQW) structure, a quantum-wire structure, or a quantum dot structure. For example, the active layer may comprise a quantum well/quantum barrier structure. For example, the active layer may be formed of any one or more pairs of InGaN/GaN, InGaN/InGaN, GaN/AlGaN, InAlGaN/GaN, GaAs/AlGaAs, InGaP/AlGaP and GaP/AlGaP.

The frame 130 may include a support portion 132 and a guide portion 134, which will be described in detail with reference to FIG. 3

With reference to FIG. 3, a flash module 100 according to an embodiment includes a substrate 110 including a predetermined cavity C, and a plurality of light emitting chips 112 disposed in a cavity C of the substrate 110, A frame 130 disposed on the substrate 110 and including a guide part 134 and a support part 132 including a through hole H1 (see FIG. 2), and a lens unit 140 disposed in the through hole H1 of the light guide plate 134. The substrate 110 may include an insulating material such as a ceramic material. The ceramic material may include a low temperature co-fired ceramic (LTCC) or a high temperature co-fired ceramic (HTCC). The material of the substrate 110 may be AlN and may be formed of a metal nitride having a thermal conductivity of 140 W/mK or more.

Alternatively, the substrate 110 may be formed of a resin material or a ceramic material such as a resin-based insulating material such as polyphthalamide (PPA). The substrate 110 may be formed of a thermosetting resin including silicon, an epoxy resin, or a plastic material, or a material having high heat resistance and high light resistance. The above silicon may include a white-based resin.

A cavity C may be formed in the substrate 110, and the cavity C may have a concave shape with an open top. The cavity C may be formed in a circular shape, an elliptical shape, or a polygonal shape when viewed from above the light emitting chip 120, but the embodiments is not limited thereto. The side surface of the cavity C may be inclined or vertically formed at a predetermined angle with respect to the bottom surface of the cavity C or a top surface of a predetermined lead frame (not shown).

A predetermined lead frame (not shown) may be formed on the substrate 110 in a single or a plurality of layers. The lead frame may be formed of a metal plate having a predetermined thickness, another metal layer may be plated on the surface of the metal plate, but it is not limited thereto.

The lead frame may be made of a metal such as Ti, Cu, Ni, Au, Cr, Ta, Pt, Sn, Ag, P, or an alloy thereof, and may be formed as a single layer or a plurality of layers. When the lead frame is an alloy, it may include copper (Cu) and at least one kind of metal alloy such as a copper-zinc alloy, a copper-iron alloy, a copper-chromium alloy and a copper-silver-.

The light emitting chip 120 may be disposed on the lead frame, and may be electrically connected to the lead frame. The light emitting chip 120 may be a flip chip type light emitting chip, but the embodiment is not limited thereto.

In an embodiment, a plurality of the light emitting chips 120 may be disposed. For example, the plurality of light emitting chips 120 may be disposed at least two or more, but the embodiments are not limited thereto. For example, the light emitting chip 120 may include a first light emitting chip 121, a second light emitting chip 122, a third light emitting chip 123, and a fourth light emitting chip 124. For example, in FIG. 3, the first light emitting chip 121 and the fourth light emitting chip 124 are illustrated as an example of the plurality of light emitting chips 120, but the embodiments is not limited thereto.

The plurality of light emitting chips 120 may be individually driven and emit light of the same color, for example, white.

Referring to FIG. 3, in the embodiment, the light emitting chip 120 and the lens unit 140 may be spaced apart from each other by a predetermined distance L2.

For example, in the embodiment, the optical gap (L2) between the first light emitting chip 121 or the fourth light emitting chip 124 and the lens unit 140 is precisely controlled to provide a slim flash module having wide angle can be implemented. For example, in the embodiment, the optical gap L2 between the first light emitting chip 121 or the fourth light emitting chip 124 and the lens unit 140 is precisely controlled to about 0.2 to 0.5 mm, so a slim flash module can be implemented with a wide angle of view. When the optical gap L2 between the first light emitting chip 121 or the fourth light emitting chip 124 and the lens unit 140 is less than 0.2 mm in the embodiment, there is a problem that it becomes too narrow, and when it exceeds 0.5 mm, there is a problem that the light distribution characteristic becomes too wide as the optical distance becomes wider.

In addition, the thickness L1 of the substrate 110 combined with the frame 130 can be controlled to a thickness ranging from about 4 to 6 times of the height H of the light emitting chip, thereby providing a wide view angle, it is possible to implement a uniform light distribution in the camera imaging area and implement a slim flash module.

For example, when the height H of the fourth light emitting chip 124a is about 0.3 mm, the total thickness L1 of the substrate 110 and the frame 130 may range from 1.2 mm to 1.8 mm. When the thickness L1 of the substrate 110 and the frame 130 is less than four times of the height H of the light emitting chip in the embodiment, the space occupied by the flash module in the cell phone is small, thereby an air gap becomes too large and the optical characteristics becomes lower.

In the embodiment, when the thickness L1 of the substrate 110 and the frame 130 is more than six times of the height H of the light emitting chip, the thickness of the flash module is too large in the cell phone, may not have an appropriate dispersion distribution, and there is a problem that assembly may not be performed due to interference with a device such as a mobile phone, etc., on which the flash module is mounted.

In addition, in the embodiment, the outer width S1 of the substrate 110 of the flash module has a width in the range of about 3 to 5 times of the horizontal width W of the light emitting chips 121 and 124, it is possible to implement one distribution and provide a slim and compact flash module.

For example, when the horizontal width W of the light emitting chip mounted on the flash module is about 1.1 mm, the outer width S1 of the substrate 110 may be about 3.3 mm to about 5.5 mm. In addition, since the outside width S1 of the substrate 110 is controlled to be about 4.6 m to 5.2 mm, it is possible to provide a wide angle, uniform distribution of light, and a slim and compact flash module.

If the outer width S1 of the substrate 110 is less than three times of the horizontal width W of the light emitting chips 121 and 124, the optical characteristics may be degraded due to interference of light between the light emitting chips. On the other hand, when the outer width S1 of the substrate 110 exceeds 5 times of the horizontal width W of the light emitting chips 121 and 124, it is impossible to provide a uniform light distribution according to the increase in the spacing S3 between the light emitting chips. Or it may be difficult to provide a compact flash module.

The width S2 of the inner cavity C of the substrate 110 in the flash module of the embodiment may be in the range of about 2 to about 4 times of the horizontal width W of the light emitting chips 121 and 124, Accordingly, the layout of the lens unit 140 and the distribution of the light emitting chip can be appropriately controlled, and uniform distribution of the light emitted from the light emitting chip can be implemented, and a slim and compact flash module can be provided.

For example, when the horizontal width W of the light emitting chip mounted on the flash module is about 1.1 mm, the width S2 of the inner cavity C of the substrate 110 is about 2.2 mm to 4.4 mm. Further, since the width S2 of the inner cavity C of the substrate 110 is controlled to be about 3.5 m to 4.0 mm, a more uniform distribution of the light emitted from the light emitting chip can be implemented, and a slim and compact flash module can be provided.

If the width S2 of the inner cavity C of the substrate 110 is less than twice the horizontal width W of the light emitting chips 121 and 124, optical characteristics may be degraded due to interference of light between the light emitting chips. On the other hand, when the width S2 of the inner cavity C of the substrate 110 is more than four times of the horizontal width W of the light emitting chips 121 and 124, the lens unit 140 may be enlarged and it is difficult to provide a uniform flash distribution module due to the increase of the separation distance S3 between the light emitting chips or to provide a compact flash module.

The distance S3 between the light emitting chips 121 and 124 disposed in the inner cavity C of the substrate 110 is about ½ to 1.0 times of the horizontal width W of the light emitting chips 121 and 124 itself, it is possible to provide an angle of view of a wide angle and to implement a uniform distribution of light in the camera image sensing area.

On the other hand, when the distance S3 between the light emitting chips 121 and 124 arranged in the inner cavity C of the substrate 110 is less than ½ times of the horizontal width W of the light emitting chips 121 and 124 themselves, there may arise a problem in the process of mounting the light emitting chip, and there may arise a problem that the optical characteristic and electrical characteristic are lowered due to heat generated in the light emitting chip after mounting.

On the other hand, when the distance S3 between the light emitting chips 121 and 124 arranged in the inner cavity C of the substrate 110 is larger than the horizontal width W of the light emitting chips 121 and 124 itself, it is difficult to align the light diffusion patterns P1 and P2 between the upper and lower portions of the light guide plate 140, thus making it difficult to implement a uniform light distribution.

The distance S4 between the side surfaces of the substrate 110 and the light emitting chips 121 and 124 of the embodiment is controlled to be about ½ to 1.0 times of the horizontal width W of the light emitting chips 121 and 124 itself, thereby it is possible to implement a uniform light distribution in the camera imaging region, to provide a wide view angle, and to provide a compact flash module.

On the other hand, when the distance S4 between the light emitting chips 121 and 124 and the side surface of the substrate 110 is more than one time the horizontal width W of the light emitting chips 121 and 124 itself, The possibility of misalignment between the patterns P1 and P2 and the upper and lower portions may increase, which may make it difficult to implement a uniform light distribution.

On the other hand, when the distance S4 between the light emitting chips 121 and 124 and the side surface of the substrate 110 is less than ½ of the horizontal width W of the light emitting chips 121 and 124 themselves, There may arise a problem that optical characteristics and electrical characteristics are deteriorated due to heat generated in the light emitting chip after mounting.

The lens unit 140 mounted on the flash module 100 according to the embodiment includes a plurality of light diffusion patterns P1 and P2 to increase light diffusion of the light emitted from the light emitting chip 120, a wide angle of view (FOV) can be implemented. For example, the light emitting module may include a second light diffusion pattern P2 and a first light diffusion pattern P1 corresponding to the first light emitting chip 121 and the fourth light emitting chip 124, When there are four light emitting chips as in the example, four light diffusion patterns may be provided.

Referring again to FIG. 3, the phosphor layers 121b and 124b may be disposed on the plurality of light emitting chips 120. For example, the first light emitting chip 121 may include a blue LED chip 121a and a first yellow phosphor layer 121b. The fourth light emitting chip 124 may include a blue LED chip 124a and a fourth yellow phosphor layer 124b.

The second light emitting chip 122 may include a second LED chip (not shown) and a second phosphor layer (not shown), and the third light emitting chip 123 may include a third LED chip (not shown) and a third phosphor layer (not shown).

When the light emitting chip 120 is a blue LED chip, the phosphor layer may include at least one of a green phosphor, a red phosphor, and a blue phosphor.

For example, a clear camera flash can be implemented by controlling the content ratio (wt %) of the blue phosphor: green phosphor:red phosphor to 40 to 60%: 10 to 20%: 25 to 45 t %, for example.

For example, the peak wavelength of the blue phosphor may be about 450 nm, the peak wavelength of the green phosphor may be about 517 nm, and the peak wavelength of the red phosphor may be about 661 nm, but is not limited thereto.

In an embodiment, the half width of the green phosphor may be 50 to 60, and the half width of the red phosphor may be 90 to 100, but the embodiments is not limited thereto.

Figure 5:
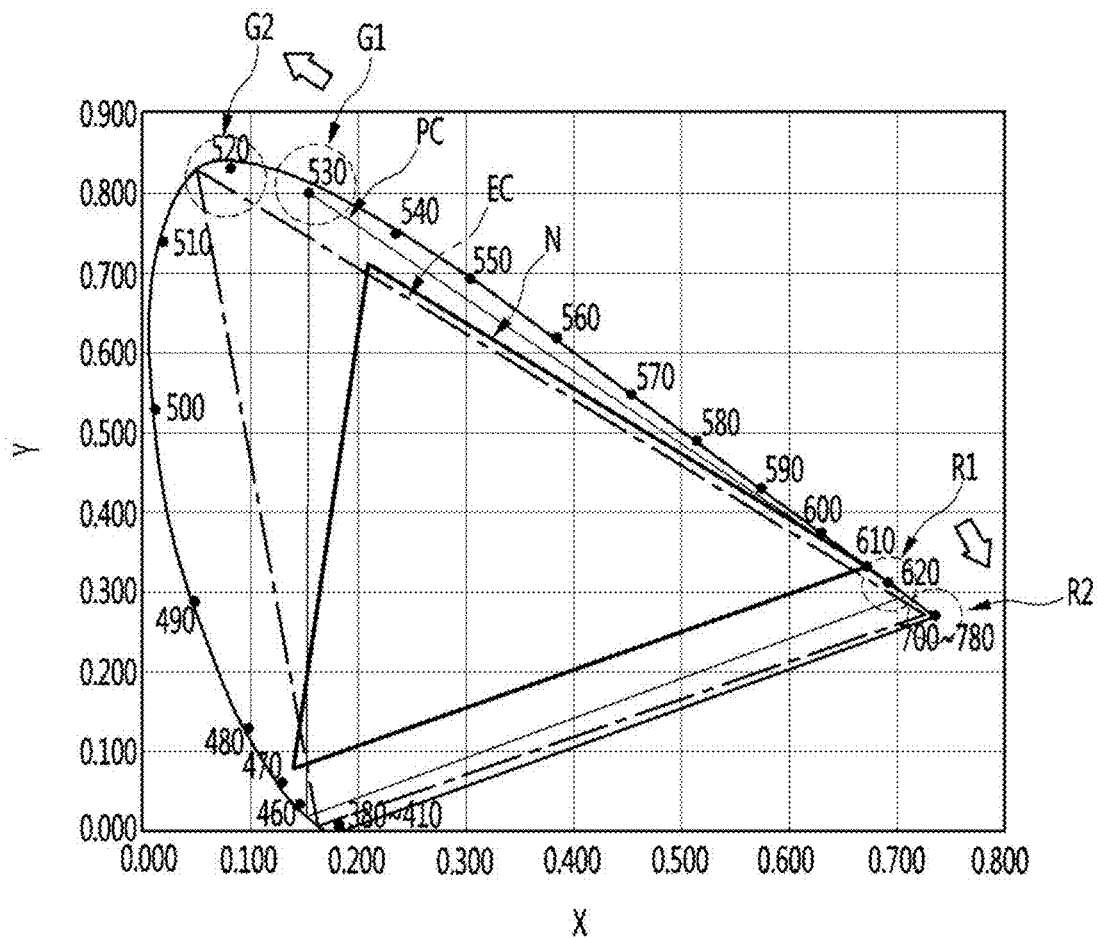
FIG. 5 is a diagram showing examples of CIE chromaticity coordinates and color reproduction range of the embodiment and the comparative example.

Referring to FIGS. 4 and 5, technical solutions and technical effects for solving the technical problems of the embodiments will be described in more detail.

One of the technical problems to be solved of the embodiments is to provide a flash module and a terminal capable of implementing a clear color.

FIG. 4 is a comparative example of a wavelength spectrum (S) of sunlight, an emission wavelength spectrum (PS) of a comparative example and an emission spectrum (ES) in a light emitting chip of a flash module according to an embodiment, Color coordinate and color reproduction range.

In the related art flash module, the light emitting chip implements white light including a green phosphor and a red phosphor on a blue LED chip.

For example, the light emitting chip of the related art has implemented a white light including a green phosphor having an emission wavelength of about 530 nm and a red phosphor having an emission wavelength of about 630 nm on a blue LED chip having an emission wavelength of 420 to 450 nm.

Accordingly, as shown in FIG. 4, the emission wavelength spectrum PS of the related art (comparative example) did not exhibit a uniformly uniform wavelength distribution corresponding to the wavelength spectrum S of the sunlight.

That is, the role of the camera flash is important in order to implement a vivid color in a camera. The vivid color can be expressed by a CQS (Color Quality Scale) index. In the related art, since the uniform wavelength distribution corresponding to the wavelength spectrum S cannot be implemented, the CQS (Color Quality Scale) index remains at about 70 to 80, which limits the implementation of a clear color.

For example, the light emitting chip employed in the flash module of the related art has a weak emission intensity at a wavelength of about 410 nm or less and a light emission wavelength of about 500 nm in a green phosphor region and a red phosphor due to the weak wavelength spectrum, the CQS (Color Quality Scale) index was low and there was a limit to the implementation of vivid color.

On the other hand, when the UV wavelength (365 to 385 nm) is applied, there is a harmful problem to the human body, and it is difficult to adopt it as a light emitting chip of Flash for a mobile phone.

In an embodiment, when the light emitting chip 120 is a blue LED chip, the phosphor layer may include at least one of a green phosphor, a red phosphor, and a blue phosphor to implement a vivid color. For example, the phosphor composition of the embodiment may include, but is not limited to, a green phosphor and a red phosphor.

In the embodiment, as shown in FIG. 4, when the light emitting chip 120 is a blue LED chip, the phosphor layer may include a green phosphor, a red phosphor, and a blue phosphor.

For example, a clearer camera flash can be implemented by controlling the content ratio (wt %) of the blue phosphor: green phosphor:red phosphor to 40 to 60%:10 to 20%:25 to 45% in the phosphor composition of the embodiment. On the other hand, when the content ratio of the phosphor composition of the embodiment is out of the range, it is difficult to implement a desired spectrum and the light efficiency is inferior.

Specifically, as shown in FIG. 4, when the emission center wavelength of the light emitting chip is 400 nm to 420 nm, the wavelength intensity (EB1 region) of the emission center wavelength of 400 nm to 420 nm of the light may be greater than the wavelength intensity of 400 nm to 420 nm.

In the embodiment, the red phosphor has a luminescent center wavelength of 650 nm to 670 nm with an excitation wavelength of 400 nm to 420 nm of the light emitting chip, a wavelength intensity (ER region) of the excitation center wavelength of 650 nm to 670 nm of the red phosphor, may be greater than the wavelength intensity of 650 nm to 670 nm of the solar light source.

For example, the wavelength intensity ER of 650 nm to 670 nm of the wavelength spectrum (ES) of the flash module according to the embodiment is about 10% to 30% of the wavelength intensity of 650 nm to 670 nm of the solar light source wavelength spectrum S, Wide range, thereby implementing a vivid color.

On the other hand, the light emitting chip of the related art has small wavelength intensity at 400 nm to 420 nm, and the wavelength intensity at 650 nm to 670 nm of the red phosphor is also insignificant.

Accordingly, in the related art, the CQS (Color Quality Scale) index was about 80.0 and the CRI was about 77.0, but in the embodiment, the CQS (Color Quality Scale) index was greatly increased to about 92.1 and the CRI was also remarkably increased to 90.2.

Also, CRI treats the pure red R9 data as important, which was about −11.1 in the related art, but increased significantly to 70.6 in the embodiment.

Accordingly, according to the embodiment, the CQS (Color Quality Scale) index and the CRI index significantly increase, so that a vivid color can be implemented.

In addition, in the embodiment, the full width at half maximum (FWHM) of the red phosphor is about 90 to 100, so that compared with the conventional red phosphor having a half width of about 70 nm, the embodiment can contribute to a clear color by widening the distribution range of the red wavelength.

In addition, the phosphor composition of the embodiment may include a green phosphor, and the green phosphor may have a center wavelength of 505 nm to 525 nm in which the emission wavelength of the light emitting chip 120 is 400 nm to 420 nm as an excitation wavelength.

As a result, the wavelength intensity of the wavelength spectrum in the range of 505 nm to 525 nm is improved as compared with the related art, and a clear color can be implemented.

For example, in the related art wavelength spectrum (PS), the wavelength intensity at 505 nm to 525 nm was less than about 50%, for example, 30% of the wavelength intensity of the solar light source spectrum S, the wavelength intensity at 505 nm to 525 nm in the wavelength spectrum (ES) in the module can be shifted to about 60% or more, for example, about 70% or more of the wavelength intensity of the solar light source spectrum (S), thereby it is possible to implement a vivid color.

Further, the half width of the green phosphor may be 50 to 60, and the half width of the green phosphor in the related art is about 30 nm, which can contribute to a clear color by widening the distribution range of the green wavelength of the embodiment.

Further, the phosphor composition may include a blue phosphor, and the blue phosphor may have a luminescent center wavelength (EB2 region) having an excitation wavelength of 400 to 420 nm of the light emitting chip 120 of 455 nm to 465 nm.

Thus, by implementing the wavelength spectrum close to the wavelength spectrum of the sunlight by improving the wavelength intensity of the wavelength spectrum in the 455 nm to 465 nm wavelength region as compared with the related art, a clearer color can be implemented.

FIG. 5 is an illustration of an example of CIE color coordinates and color reproduction range (N) in Examples and Comparative Examples.

In order to implement a vivid color according to an embodiment, a high color gamut must be supported. However, the related art has a low color reproduction rate and thus has a limitation in implementing a vivid color.

Referring again to FIG. 5, an NTSC color reproduction range (N), a color reproduction range (EC) of the embodiment, and a color reproduction range (PC) of the related art are shown in the CIE color coordinates.

As described above, the emission wavelength of the green phosphor or the emission wavelength of the red phosphor must be shifted to a deeper side in order to improve the color reproducibility in the conventional LED. In the conventional red phosphor, there is a drawback that emission wavelength does not move to loner wave.

The phosphor composition according to an embodiment of the embodiments for solving such problems includes a red phosphor of $Mg_2Ge_2O_3F_2:Mn^{4+}$ or $(Sr,Mg)GeOF:Mn^{4+}$. The original three-wavelength spectrum can be implemented. Such a phosphor composition is a specific example of a red phosphor composition. In addition to these compositions, a red phosphor capable of emitting a red wavelength spectrum with an excitation wavelength of a blue emission wavelength is also possible.

According to the embodiment, the development of a red phosphor of a new and differentiated $Mg_2Ge_2O_3F_2:Mn^{4+}$ or $(Sr,Mg)GeOF:Mn^{4+}$. The color reproducibility of the embodiment can be remarkably improved by improving (R 2) from about 650 nm to 670 nm as compared with the technique (R 1). For example, the red phosphor of the $(Sr,Mg)GeOF:Mn^{4+}$ series of the embodiment may be $(Sr,Mg)_4GeO_3F_2:Mn^{4+}$, but is not limited thereto.

Further, in the phosphor composition of the embodiment, the green phosphor may be $BaMgAl_{10}O_{17}:Eu^{2+},Mn^{4+}$, but is not limited thereto. Such a phosphor composition is a specific example of a green phosphor composition. In addition to such a composition, a red phosphor capable of emitting a green wavelength spectrum at an excitation wavelength of a blue emission wavelength is also possible.

According to the embodiment, the development of a green phosphor of $BaMgAl_{10}O_{17}:Eu^{2+},Mn^{4+}$ which is new and differentiated has resulted in an emission peak having a maximum intensity at about 505 nm To 525 nm (G2), the color reproduction ratio of the embodiment can be remarkably improved.

According to the embodiment, it is possible to provide a phosphor composition, a flagship module, and a terminal that can implement a vivid color by implementing a high color reproduction rate.

One of the technical problems to be solved of the embodiments is to provide a flash module capable of implementing a wide angle of view (FOV) of a camera flash and a terminal including the flash module so as to cope with the trend of technological development of a camera of a terminal.

It is another one of the technical problems to be solved of the embodiments to provide a flash module and a terminal including the flash module that can simultaneously satisfy a slim trend of a terminal and a wide angle of view (FOV) technical characteristics.

FIG. 3, the embodiment of the embodiments includes a frame (not shown) disposed on the substrate 110, including a guide part 134 including a predetermined through hole H1 and a support part 132, 130 and a lens unit 140 disposed in the through hole H1 of the guide portion 134.

In an exemplary embodiment, the frame 130 may be formed of a resin-based insulating material, such as a resin material such as polyphthalamide (PPA), or a ceramic material. Further, the frame 130 may be formed of a thermosetting resin containing silicon, epoxy resin, or plastic material, or a material having high heat resistance and high light resistance. The above silicon may include a white-based resin. The frame 130 may be formed of W-EMC or W-Silicone.

In the embodiment, the lens unit 140 may be made of a plastic material such as an acrylic plastic material. Examples of the lens unit 140 include, but are not limited to, PMMA (polymethyl methacrylate). PMMA, which is a material of the lens unit 140 employed in the embodiment, has an advantage of being superior in transparency to glass and being easy to process and mold.

In the embodiment, the lens unit 140 may function as a lens such as a light extracting lens or a light diffusing lens, and is a member for changing a directivity characteristic of light emitted from the light emitting chip 120, However, a transparent material having a refractive index of 1.4 or more and 1.7 or less can be used.

The lens unit 140 may be formed of a transparent resin material such as polycarbonate (PC) or epoxy resin (EP), transparent glass, EMC, or Silicone, but is not limited thereto.

Referring now to FIGS. 2 and 3, the principle of how the lens unit 140 is supported within the frame 130 in the embodiment and the advantageous technical effects when such is the case will be described.

In the embodiment, since the guide part 134 of the frame 130 and the lens part 140 can be a double injection structure, the bonding process is very efficient, and in particular, the thickness of the camera flash module can be made very slim have.

In the related art, the thickness of the flash module including the lens unit is about 2.5 mm or more, and it is difficult to reduce the thickness. This is because, in the related art, after the SMT (Surface Mounting Technology) operation is performed on the package substrate of the light emitting module, the lens is separately attached to the camera cover case to limit the thickness of the camera flash module.

In contrast, according to the embodiment, since the lens unit 140 is formed as an injection structure in the guide part 134 of the frame 130, the thickness of the camera flash module 100 itself can be formed very slimly at a level of about 1.4 mm; there is an advantageous technical effect. The thickness of the lens unit 140 can be controlled to be about half or less of the total thickness of the camera flash module 100 and the thickness of the camera flash module 100 itself can be formed very slim.

Also, according to the related art, as the lens is separately attached to a camera cover case, a pin contact, or the like, the thickness of the lens is increased and problems such as adhesion are encountered.

However, in the embodiment, if a hole having a size corresponding to the camera flash module 100 is provided in a camera case (not shown), it is directly coupled to the SMT type and may not be separately connected to the mobile phone case. It is very easy to assemble the mobile phone, and it can obtain a strong coupling, and has a favorable technical effect to implement a slim portable terminal.

In addition, according to the embodiment, the upper surface of the lens unit 140 is disposed at the same position or lower position as the guide portion 134 of the frame 130, thereby implementing a slim camera module and a wide angle of view (FOV) There is a favorable technical effect to be gained.

For example, in the camera module of the embodiment, since there is no camera case or other coupling parts for coupling the lens unit 140 in addition to the guide 134 of the frame, the area for blocking light emitted from the camera flash can be minimized, There is an advantageous technical effect that the maximum wide angle can be implemented by the design such as the thickness and the inclination.

Further, in the embodiment, an optical gap (L) between the light emitting chip 120 and the lens unit 140 is precisely controlled to implement a slim flash module with an angle of view of wide angle. For example, in the embodiment, the optical gap (L) between the light emitting chip 120 and the lens unit 140 is precisely controlled to about 0.3 to 0.5 mm, and a slim flash module, there is a technical effect that can be implemented.

Figure 6:
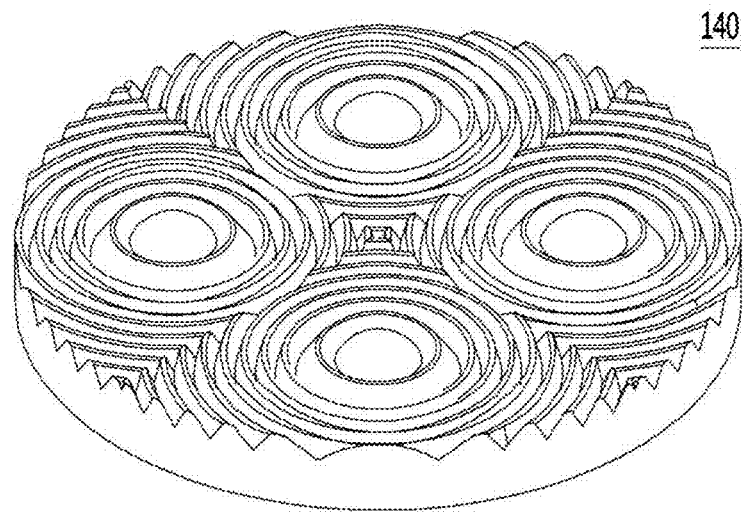
FIG. 6 is a perspective view of the lens unit in the flash module according to the embodiment.
Figure 7:
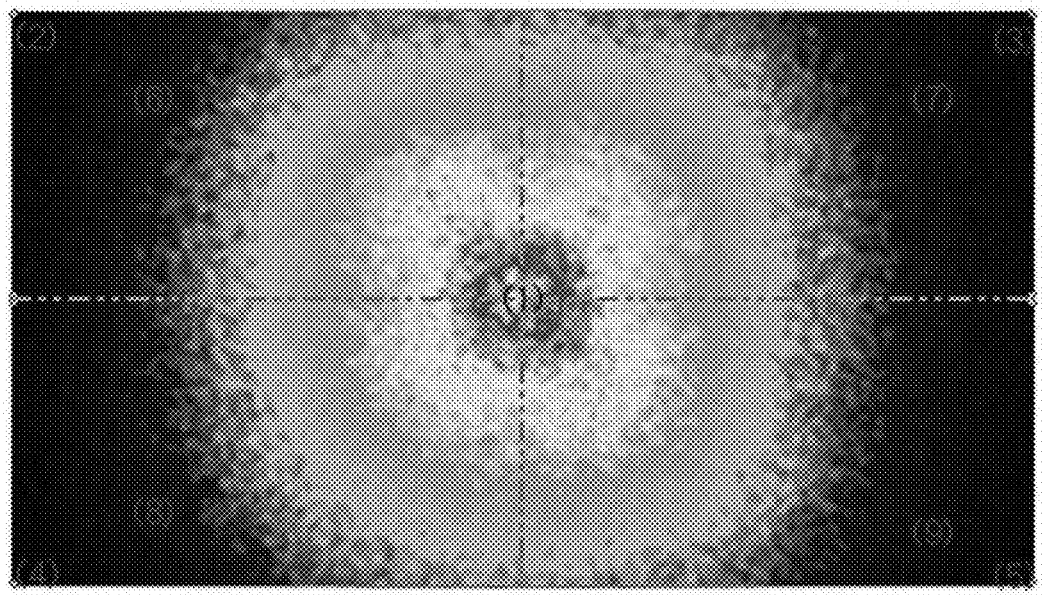
FIG. 7 is a light distribution data of a flash module according to an embodiment.
Figure 8:
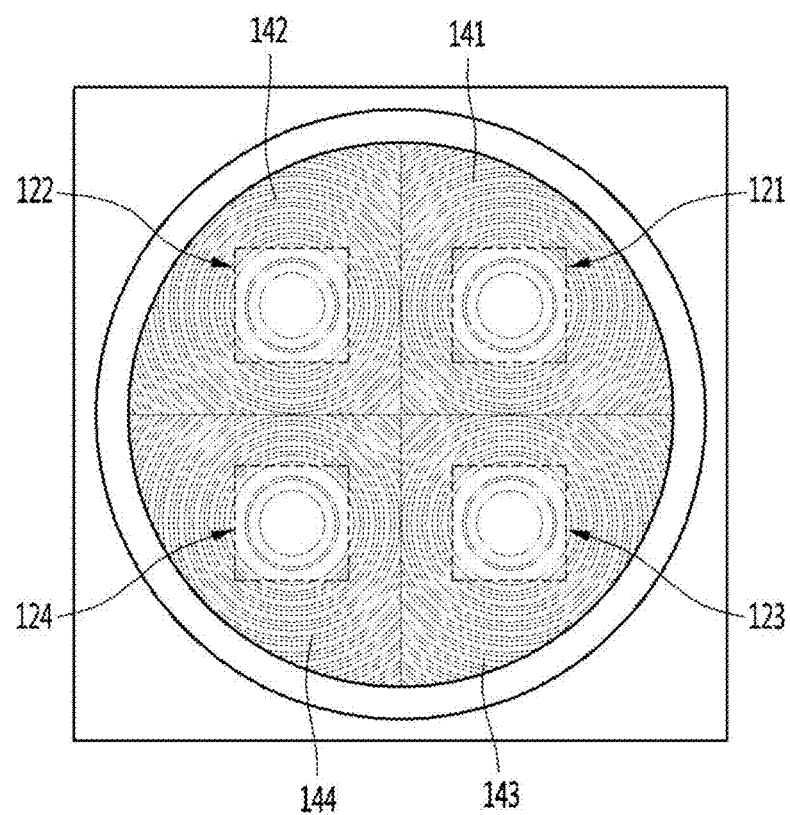
FIG. 8 is a projection view of a lens part and a light emitting chip in a flash module according to an embodiment.

FIG. 6 is a perspective view of the lens unit in the flash module according to the embodiment, FIG. 7 is a light distribution data of the flash module according to the embodiment, and FIG. 8 is a projection view of the lens unit and the light emitting chip in the flash module according to the embodiment.

One of the technical problems to be solved of the embodiments is to provide a flash module capable of implementing a uniform light distribution in a camera image sensing area while implementing a wide angle of view (FOV) and a terminal including the flash module.

In addition, one of the technical problems to be solved of the embodiments is to provide a flash module and a terminal including the same, which can implement a uniform light distribution while improving efficiency of alignment process and robustness by significantly improving the alignment accuracy of the light emitting chip and the flash lens of the light emitting module.

Referring to FIGS. 6 and 8, the lens unit 140 according to the embodiment may include a plurality of light diffusion patterns. For example, when four light emitting chips 120 are provided, the first light diffusion pattern 141, the second light diffusion pattern 142, the third light diffusion pattern 143, and the fourth light diffusion pattern 144, but it is not limited thereto.

It is possible to obtain a uniform light distribution with the wide angle of view (FOV) of the optical angle as the coincidence of the distribution of the light ray from the plurality of light emitting chips 120 and the optical diffusion pattern of the lens unit 140 becomes greater.

In the embodiment, the light emitting chips 120 are arranged in the light diffusing patterns 141, 142, 143 and 144 in the top view of the lens unit 140, and the light emitting chips 121, there is a technical effect that the center of the center can be matched.

In the related art, according to the SMT of the light emitting module and the lens separately attached to the cover case of the mobile phone, the tolerance of about 50 μm or more is inevitable in the related art due to the SMT tolerance and the lens mounting tolerance, therefore uniform distribution of light cannot be obtained.

On the contrary, in the embodiment, since the lens unit and the frame integrally formed by the double injection can be bonded only once to the substrate, the adhesion can be facilitated and the thickness can be made slimmer.

Further, there is an advantageous technical effect. For example, in the embodiment, by controlling the light diffusion pattern of the lens part and the alignment tolerance of the light emitting chip to be about 25 μm or less, it is possible to remarkably improve the correspondence between the directivity characteristic of light emitted from the light emitting chip and the light diffusion pattern of the lens part, so there is an advantageous technical effect that it is possible to obtain a uniform light distribution by improving the light distribution characteristic in addition to the implementation of the wide view angle (FOV).

Further, according to the embodiment, since the distance between the center of the lens unit 140 and the center of each light emitting chip 120 is controlled to be about 70 μm or less, there is an advantageous technical effect that uniform light distribution can be obtained while implementing a wide angle.

In the related art, the frame, the PCB, and the frame and the lens are bonded twice. In this embodiment, since the lens unit and the frame integrally formed by the double injection are bonded only once to the substrate. Furthermore, there is an advantageous technical effect that the alignment between the light emitting chip and the light diffusion pattern of the lens unit can be precisely controlled to implement a wide angle of view (FOV) and to obtain a very uniform light distribution.

Referring to FIG. 7, the embodiment can obtain the uniform optical characteristic distribution shown in Table 1 as below.

TABLE 1

| FOV 135 deg. | | lx | mean | % |
|---|---|---|---|---|
| Center | (1) | 188.5 | — | — |
| 1.0 F | (2) | 8.6 | 8.48 | 4.5% |
| | (3) | 8.4 | | |
| | (4) | 8.7 | | |
| | (5) | 8.2 | | |
| 0.7 F | (6) | 29.7 | 28.9 | 15.3% |
| | (7) | 28.4 | | |
| | (8) | 29.1 | | |
| | (9) | 28.4 | | |

According to the wide angle camera technology, the angle of view (FOV) of the flash module required in the industry requires a wide angle of about 120° or more as a dual camera is continuously developed, and further, a uniform light distribution characteristic is required. However, in the case of implementing a wide angle, it is in a state of technical contradiction that it becomes difficult to implement a uniform light distribution.

Meanwhile, according to the embodiment, the angle of view (FOV) of the camera flash can be implemented up to 120°, and it can be implemented up to 135°.

FIG. 7 and Table 1 are light distribution data when the angle of view (FOV) is 135°.

1.0F and 0.7F are the luminous intensity (lx) at 1M distance at F (field) of 1.0 and 0.7 respectively, and the mean is 8.48 lx at 1.0F and 28.9 lx at 0.7F, and the light distribution characteristics of F (field) relative to the center illuminance are remarkably improved by 4.5% and 15.3%, respectively, compared with the inventor's previous invention (unpublished).

Thus, according to the embodiment, there is an excellent technical effect of solving the conventional technical contradiction by providing a flash module that can distribute light uniformly over the entire area of the sensing area and also implement a wide angle of 120° or more.

Figure 9A:
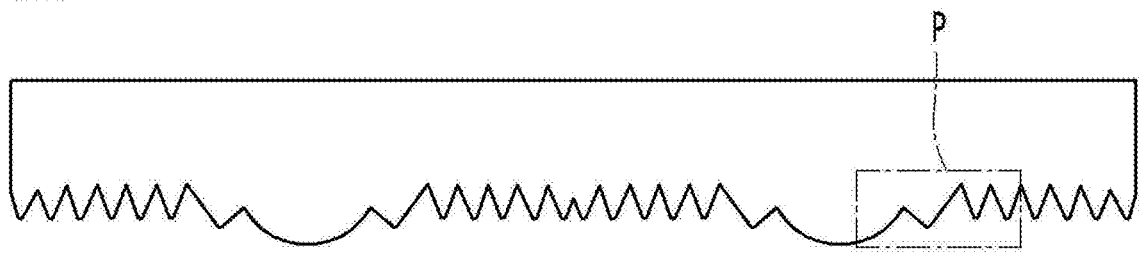
FIGS. 9A and 9B are cross-sectional views of a lens unit in a flash module according to an embodiment.
Figure 9B:
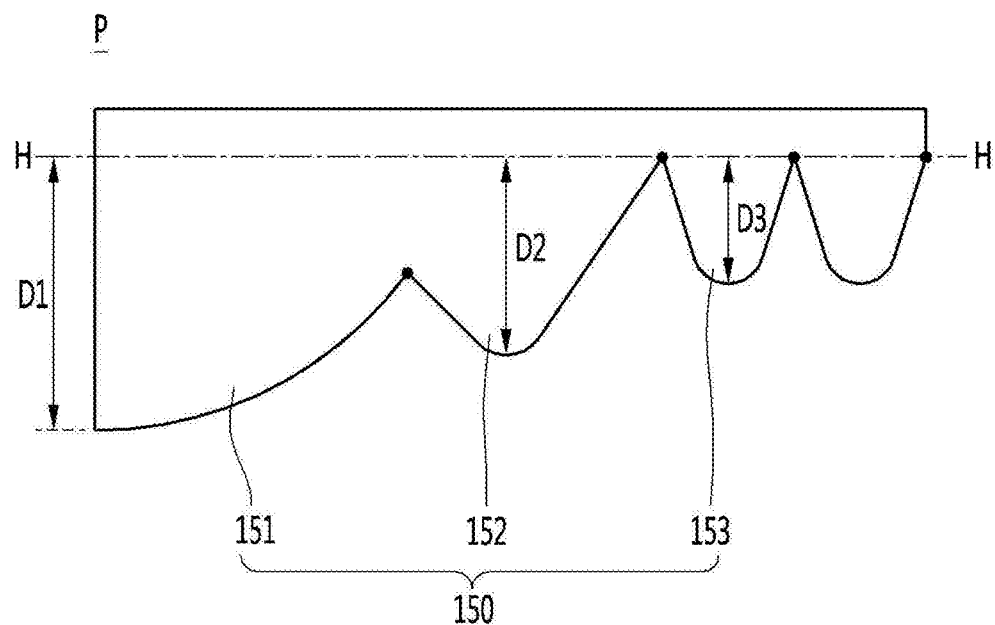

FIG. 9A is a cross-sectional view of the second lens unit 150 in the flash module according to another embodiment, and FIG. 9B is an enlarged view of a portion P of the second lens unit.

Other embodiments may adopt the technical features of the embodiments described above, and the following description will focus on the main features of the other embodiments.

Referring to FIG. 9B, the second lens unit 150 may include a plurality of protruding patterns protruding downward at different distances with respect to a predetermined horizontal height H.

For example, the second lens unit 150 may include a first protrusion pattern 151 protruding at a first distance D1 and a second protrusion pattern 152 protruding at a second distance D2 shorter than the first distance D1 and a third protruding pattern 153 protruding at a third distance D3 shorter than the second distance D2 to obtain a uniform light distribution.

The first point where the first protrusion pattern 151 and the second protrusion pattern 152 meet may be arranged to be lower than the predetermined horizontal height. The second point where the second protrusion pattern 152 and the third protrusion pattern 153 meet may be the same height as the predetermined horizontal height.

According to another embodiment, the first point where the first protruding pattern 151 and the second protruding pattern 152 meet is controlled to be lower than the predetermined horizontal height to strengthen the light diffusion function, The second point where the protrusion pattern 152 and the third protrusion pattern 153 meet is controlled to be the same height as the predetermined horizontal height so that the third protrusion pattern 153 enhances the function of extracting light, thereby implementing a wide angle of view (FOV) and simultaneously achieving a uniform light distribution by enhancing the light extraction performance.

One of the technical effects of the embodiment is to provide a flash module capable of implementing a clear color and a terminal including the flash module.

Embodiments can provide a flash module having a technical effect that can implement a wide angle of view (FOV) such as a camera flash and a terminal so as to cope with the trend of camera technical development of a terminal.

In addition, the embodiment can provide a flash module having a technical effect of simultaneously satisfying technical characteristics such as a slim trend of a terminal and a wide angle of view (FOV), and a terminal including the flash module.

Also, the embodiment can provide a flash module having a wide angle of view (FOV) and a technical effect capable of implementing a uniform light distribution in a camera imaging region, and a terminal including the same.

Also, the embodiment can provide a flash module having a technical effect that can achieve a uniform light distribution by significantly improving the alignment accuracy of the light emitting chip and the flash lens of the light emitting module, and a terminal including the flash module.

The flash module according to the embodiment may be employed in a terminal. The terminal may include a mobile phone, a smart phone, a tablet PC, a notebook, a PDA (Personal Digital Assistant), and the like, but is not limited thereto.

INDUSTRIAL APPLICABILITY

The features, structures, effects and the like described in the embodiments are included in at least one embodiment and are not necessarily limited to one embodiment. Furthermore, the features, structures, effects and the like illustrated in the embodiments can be combined and modified by other persons skilled in the art to which the embodiments belong. Accordingly, the contents of such combinations and modifications should be interpreted as being included in the scope of the embodiments.

While the embodiments has been particularly shown and described with reference to exemplary embodiments thereof, it is to be understood that the invention is not limited to the disclosed embodiments. It can be seen that the modification and application of branches are possible. For example, each component specifically shown in the embodiments can be modified and implemented. It is to be understood that the embodiments may be embodied in many other specific forms without departing from the spirit or essential characteristics thereof.

The invention claimed is:

1. A flash module comprising:
    a substrate including a predetermined cavity having an opened top;
    a plurality of light emitting chips provided in the cavity, and the light emitting chips are spaced apart from each other in the cavity of the substrate;
    a frame disposed on the substrate including a support portion and a guide portion, the support portion having a top surface and a bottom surface, the bottom surface of the support portion facing the substrate, and the guide portion extending upward from the top surface of the support portion, the frame having a predetermined through hole defined by the guide portion and passing through the support portion;
    a lens unit disposed in the through hole of the guide portion; and
    phosphor composition on the plurality of light emitting chips,
    wherein the lens unit includes a plurality of light diffusion patterns on a bottom surface of the lens unit,
    wherein an upper surface of the lens unit is disposed at a position lower than or equal to the guide portion of the frame, and
    wherein the lens unit comprises a first protrusion pattern protruding downward for a first distance from a predetermined horizontal height and a second protrusion pattern protruding downward for a second distance from the predetermined horizontal height, wherein the second distance is less than the first distance, wherein a first point where the first protrusion pattern and the second protrusion pattern meet is arranged to be lower than the predetermined horizontal height, wherein the lens unit comprises a third protrusion pattern, the third protrusion pattern protruding downward for a third distance from the predetermined horizontal height, wherein the third distance is less than the second distance, wherein an intensity of light from the flash module having a wavelength spectrum of 400 nm to 420 nm is greater than an intensity of light from a solar light source having a wavelength of 400 nm to 420 nm.

2. The flash module according to claim 1, wherein the lens unit is injection-molded in the through-hole of the guide portion.

3. The flash module according to claim 1, wherein a height of the lens unit is lower than the guide portion of the frame.

4. The flash module according to claim 1, wherein a center of each of the plurality of light diffusion patterns is overlapped with a center of a different corresponding one of the plurality of light emitting chips.

5. A terminal comprising the flash module of claim 1.

6. The flash module according to claim 1, wherein each alignment tolerance between each center of the light diffusion patterns, and each center of the light emitting chips is about 25 μm or less.

7. The flash module according to claim 1, wherein a second point where the second protrusion pattern and the third protrusion pattern meet is at a same height as the predetermined horizontal height.

8. The flash module according to claim 1, wherein an intensity of light from the flash module having a wavelength spectrum of 650 nm to 670 nm is greater than an intensity of light from the solar light source having a wavelength of 650 nm to 670 nm.

9. The flash module according to claim 8, wherein the phosphor composition comprises a red phosphor disposed on one of the plurality of light emitting chips, wherein the one of the plurality of light emitting chips has an emission center wavelength of 400 to 420 nm, wherein the intensity of the one of the plurality of light emitting chips having the light emission center wavelength of 400 nm to 420 nm is greater than the intensity of light from the solar light source having the wavelength of 400 nm to 420 nm, wherein the red phosphor has a luminescent center wavelength of 650 nm to 670 nm with the excitation wavelength of 400 nm to 420 nm of the one of the plurality of light emitting chips, and wherein the intensity of light from the red phosphor having the excitation center wavelength of 650 nm to 670 nm is greater than the intensity of light from the solar light source having the wavelength of 650 nm to 670 nm.

10. The flash module according to claim 1, wherein a thickness of the substrate is 4 to 6 times of a height of one of the light emitting chips, and wherein an optical gap between the one of the light emitting chips and the lens unit is 0.2 to 0.5 mm.

11. A flash module comprising:

a substrate including a predetermined cavity having an opened top;

a plurality of light emitting chips provided in the cavity, and the light emitting chips are spaced apart from each other in the cavity of the substrate;

a frame disposed on the substrate including a support portion and a guide portion, the support portion having a top surface and a bottom surface, the bottom surface of the support portion facing the substrate, and the guide portion extending upward from the top surface of the support portion, the frame having a predetermined through hole defined by the guide portion and passing through the support portion; and a lens unit disposed in the through hole of the guide portion, wherein one of the plurality of light emitting chips includes a phosphor composition, wherein the phosphor composition comprises a red phosphor disposed on the one of the plurality of light emitting chips, wherein the one of the plurality of light emitting chips has an emission center wavelength of 400 nm to 420 nm, wherein an intensity of light from the one of the plurality of light emitting chips having the emission center wavelength of 400 nm to 420 nm is greater than an intensity of light from a solar light source having the wavelength of 400 nm to 420 nm, wherein the phosphor has a luminescent center wavelength of 650 nm to 670 nm with an excitation wavelength of 400 nm to 420 nm of the one of the plurality of light emitting chips, and wherein an intensity of light having the luminescent center wavelength of 650 nm to 670 nm of the red phosphor is greater than an intensity of light from the solar light source having the wavelength of 650 nm to 670 nm.

12. The flash module according to claim 11, wherein an upper surface of the lens unit is disposed at a same position or at a lower position as the guide portion of the frame.

13. The flash module according to claim 12, wherein the lens unit comprises:

a first protrusion pattern protruding downward for a first distance from a predetermined horizontal height;

a second protrusion pattern protruding for a second distance from the predetermined horizontal height, wherein the second distance is less than the first distance; and a third protrusion pattern protruding for a third distance from the predetermined horizontal height, wherein the third distance is less than the second distance.

14. The flash module according to claim 13, wherein a first point where the first protrusion pattern and the second protrusion pattern meet is arranged to be lower than the predetermined horizontal height.

15. The flash module according to claim 14, wherein a second point where the second protrusion pattern and the third protrusion pattern meet is at a same height as the predetermined horizontal height.

16. A flash module comprising:

a substrate including a predetermined cavity having an opened top;

a plurality of light emitting chips provided in the cavity, and the light emitting chips are spaced apart from each other in the cavity of the substrate;

a frame disposed on the substrate including a support portion and a guide portion, the support portion having a top surface and a bottom surface, the bottom surface of the support portion facing the substrate, and the guide portion extending upward from the top surface of the support portion, the frame having a predetermined through hole defined by the guide portion and passing through the support portion;

a lens unit disposed in the through hole of the guide portion; and phosphor composition on the plurality of light emitting chips, wherein the lens unit includes a plurality of light diffusion patterns on a bottom surface of the lens unit, wherein an upper surface of the lens unit is disposed at a position lower than or equal to the guide portion of the frame, and wherein the lens unit comprises a first protrusion pattern protruding downward for a first distance from a predetermined horizontal height and a second protrusion pattern protruding downward for a second distance from the predetermined horizontal height, wherein the second distance is less than the first distance, wherein a first point where the first protrusion pattern and the second protrusion pattern meet is arranged to be lower than the predetermined horizontal height, and wherein an intensity of light from the flash module having the wavelength spectrum of 400 nm to 420 nm is greater than the intensity of light from the solar light source having the wavelength of 400 nm to 420 nm.

17. The flash module according to claim 16, wherein an intensity of light from the flash module having the wavelength spectrum of 650 nm to 670 nm is greater than an intensity of light from the solar light source having the wavelength intensity of 650 nm to 670 nm.

* * * * *